(12) United States Patent
Wang et al.

(10) Patent No.: US 8,933,730 B2
(45) Date of Patent: Jan. 13, 2015

(54) TWO-STAGE POST DRIVER CIRCUIT

(71) Applicants: Global Unichip Corporation, Hsinchu (TW); Taiwan Semiconductor Manufacturing Co., Ltd., Hsin-Chu (TW)

(72) Inventors: Wen-Tai Wang, Hsinchu County (TW); Chao-Yen Huang, Taipei (TW)

(73) Assignees: Global Unichip Corporation, Hsinchu (TW); Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/107,052

(22) Filed: Dec. 16, 2013

(65) Prior Publication Data

US 2014/0103965 A1    Apr. 17, 2014

Related U.S. Application Data

(62) Division of application No. 13/409,408, filed on Mar. 1, 2012, now Pat. No. 8,633,737.

(30) Foreign Application Priority Data

Mar. 2, 2011    (TW) .............................. 100106975 A

(51) Int. Cl.
*H03B 1/00*    (2006.01)
*H03K 17/081*    (2006.01)
*H03K 19/003*    (2006.01)

(52) U.S. Cl.
CPC .... *H03K 17/08104* (2013.01); *H03K 19/00315* (2013.01); *H03K 19/00361* (2013.01)

USPC .......................................... 327/108; 327/112

(58) Field of Classification Search
USPC .................................................. 327/108, 112
See application file for complete search history.

(56) References Cited

U.S. PATENT DOCUMENTS

| 6,130,556 | A | 10/2000 | Schmitt et al. |
| 7,495,483 | B2 | 2/2009 | Kumar et al. |
| 8,633,737 | B2 * | 1/2014 | Wang et al. .................. 327/108 |
| 2007/0057703 | A1 | 3/2007 | Kumar et al. |

OTHER PUBLICATIONS

Hector Sanchez et al., "A Versatile 3.3/2.5/1.8-V CMOS I/O Driver Built in a 0.2-μm , 3.5-nm Tox, 1.8-V CMOS Technology", Nov. 1999, pp. 1501-1511, vol. 34, IEEE Journal of Solid-State Circuits.
Anne-Johan Annema et al., "5.5V Tolerant I/O in a 2.5V 0.25μm CMOS Technology", 2000, pp. 417-420, IEEE 2000 Custom Integrated Circuits Conference.
China Patent Office, "Office Action", Dec. 30, 2013.
Taiwan Intellectual Property Office, "Office Action", Aug. 21, 2014.

* cited by examiner

*Primary Examiner* — Hai L Nguyen
(74) *Attorney, Agent, or Firm* — WPAT, PC; Justin King

(57) ABSTRACT

A two-stage post driver circuit includes a controlling circuit, a pull-up unit and a pull-down unit. A first N-type transistor of the pull-down unit and a first P-type transistor of the pull-up unit are both connected to an output pad. The controlling circuit is used for controlling the first N-type transistor and the first P-type transistor. Consequently, when the pull-up unit or the pull-down unit is turned on, the voltage difference between the drain terminal and the source terminal of the first N-type transistor or the first P-type transistor is lower than a voltage stress.

7 Claims, 6 Drawing Sheets

TWO-STAGE POST DRIVER CIRCUIT

This is a divisional application of U.S. application Ser. No. 13/409,408, filed Mar. 1, 2012, now U.S. Pat. No. 8,633,737 issued on Jan. 21, 2014; which claims the benefit of Taiwan Patent Application No. 100106975, filed Mar. 2, 2011, the subject matter of which is incorporated herein by reference.

FIELD OF THE INVENTION

The present invention relates to a post driver circuit, and more particularly to a two-stage post driver circuit.

BACKGROUND OF THE INVENTION

During the process of packaging an integrated circuit, for making the IC chip to be connected with the package pins, the internal IC chip is usually equipped with a core circuit for providing main functions, and input/output pads are located between the core circuit and the external package pins. For designing the output pads and the input pads as the bridge between the core circuit and the external package pins, some additional factors should be taken into consideration because of the special properties thereof. Take an output pad for example. For providing sufficient driving capability, a post driver circuit is necessary for the output pad.

As known, for increasing the operating speed and reducing the power consumption of the core circuit, the core voltage of the core circuit is relatively lower (e.g. 1.8V). In contrary, the output pad connected to the external circuit needs to generate a higher output voltage (e.g. 3.3V).

Generally, the electronic component (e.g. a transistor) of the IC chip is designed to withstand a voltage stress of 1.8V. For withstanding the output voltage (3.3V) at the output pad, the post driver circuit is designed as a two-stage post driver circuit.

FIG. 1A is a schematic circuit diagram illustrating a conventional two-stage post driver circuit. The two-stage post driver circuit 110 is connected between the core circuit 100 and the output pad 120. The core circuit 100 is connected between a first source voltage V1 and a ground terminal GND. For example, the first source voltage V1 is 1.8V. Consequently, a core output signal Ocore outputted from the core circuit 100 is in the range 0V and 1.8V. That is, the high voltage level is 1.8V, and the low voltage level is 0V. The two-stage post driver circuit 110 comprises a control circuit 116, a pull-up unit 112 and a pull-down unit 114. The control circuit 116 is used for receiving the core output signal Ocore, and generating a pull-up controlling signal C_up and a pull-down controlling signal C_down.

The pull-up unit 112 comprises a first P-type transistor P1 and a second P-type transistor P2. The second P-type transistor P2 has a source terminal connected to a second source voltage V2 (e.g. 3.3V), and a gate terminal receiving the pull-up controlling signal C_up. The first P-type transistor P1 has a source terminal connected to a drain terminal of the second P-type transistor P2, a gate connected to the first source voltage V1, and a drain terminal connected to the output pad 120. The pull-down unit 114 comprises a first N-type transistor N1 and a second N-type transistor N2. The second N-type transistor N2 has a source terminal connected to the ground terminal GND, and a gate terminal receiving the pull-down controlling signal C_down. The first N-type transistor N1 has a source terminal connected to a drain terminal of the second N-type transistor N2, a gate terminal connected to the first source voltage V1, and a drain terminal connected to the output pad 120. Moreover, the two-stage post driver circuit 110 is used for generating a pad output signal Opad to the output pad 120. The pad output signal Opad is in the range between 0V and 3.3V. That is, the high voltage level is 3.3V, and the low voltage level is 0V. Moreover, for effectively controlling the second P-type transistor P2 and the second N-type transistor N2, the pull-up controlling signal C_up is in the range between V1 (e.g. 1.8V) and V2 (e.g. 3.3V), and the pull-down controlling signal C_down is in the range between 0V and V1 (e.g. 1.8V).

In a case that the core output signal Ocore is at the high voltage level (1.8V), the pull-up controlling signal C_up from the control circuit 116 is V1 (1.8V), and the pull-down controlling signal C_down from the control circuit 116 is 0V. Consequently, the pull-up unit 112 is turned on, the pull-down unit 114 is turned off, and the high voltage level (3.3V) of the pad output signal Opad is issued to the output pad 120. Whereas, in a case that the core output signal Ocore is at the low voltage level (0V), the pull-up controlling signal C_up from the control circuit 116 is V2 (3.3V), and the pull-down controlling signal C_down from the control circuit 116 is V1 (1.8V). Consequently, the pull-up unit 112 is turned off, the pull-down unit 114 is turned on, and the low voltage level (0V) of the pad output signal Opad is issued to the output pad 120.

Obviously, since each of the transistors P1, P2, N1 and N2 can withstand a voltage stress of 1.8V, the pull-up unit 112 comprises two serially-connected P-type transistors P1 and P2, and the pull-down unit 114 comprises two serially-connected N-type transistors N1 and N2. In a case that the pad output signal Opad is at the low voltage level (0V), the voltage across each P-type transistor is lower than 1.8V. Similarly, in a case that the pad output signal Opad is at the high voltage level (3.3V), he voltage across each N-type transistor is lower than 1.8V.

However, during the level transition of the pad output signal Opad from the two-stage post driver circuit 110, the voltage across the transistor possibly exceeds the voltage stress (1.8V).

FIG. 1B is a plot illustrating the voltage changes at various terminals of the first P-type transistor P1 of the pull-up unit of the conventional two-stage post driver circuit when the pad output signal Opad is changed from a low voltage level (0V) to a high voltage level (3.3V). In a case that the pull-up unit 112 is turned off and the pull-down unit 114 is turned on, the voltage (gp1) at the gate terminal of the first P-type transistor P1 is continuously maintained at the first source voltage V1 (1.8V). Since the drain terminal of the first P-type transistor P1 is connected to the output pad 120, the voltage (dp1) at the drain terminal of the first P-type transistor P1 is 0V. Since the source terminal of the first P-type transistor P1 is in the floating state, the voltage (sp1) at the source terminal of the first P-type transistor P1 is about 1.5V. At the time spot t1, the pull-up unit 112 is turned on and the pull-down unit 114 is turned off. Consequently, the pad output signal Opad is subject to level transition. Meanwhile, the pull-up controlling signal C_up received by the gate terminal of the second P-type transistor P2 has the first source voltage V1 (1.8V), and the voltage (gp1) at the gate terminal of the first P-type transistor P1 is maintained at 1.8V. Consequently, the voltage (dp1) at the drain terminal of the first P-type transistor P1 and the voltage (sp1) at the source terminal of the first P-type transistor P1 are gradually increased to the second source voltage V2 (3.3V).

Please refer to FIG. 1B again. During the level transition of the pad output signal Opad, the voltage (sp1) at the source terminal of the first P-type transistor P1 is increased at a faster speed, but the voltage (dp1) at the drain terminal of the first P-type transistor P1 is increased at a slower speed. Consequently, the difference ΔV between the source voltage (sp1) and the drain voltage (dp1) is greater than 1.8V. Under this circumstance, the first P-type transistor P1 is possibly burned out, and thus the two-stage post driver circuit fails to be normally operated.

Similarly, during the pad output signal Opad is switched from the high voltage level (3.3V) to the low voltage level (0V), the difference between the drain voltage and the source voltage of the first N-type transistor N1 of the pull-down unit 114 may exceed the voltage stress. Under this circumstance, the first N-type transistor N1 is possibly burned out.

As described in FIGS. 1A and 1B, at the moment when the pull-down unit 114 or the pull-up unit 112 of the conventional two-stage post driver circuit 110 is turned on, the difference between the drain voltage and the source voltage of the first N-type transistor N1 or the first P-type transistor P1, which is directly connected to the pad output signal Opad, is usually too large. Consequently, the possibility of damaging the transistor is increased. Therefore, there is a need of providing an improved two-stage post driver circuit to minimize the adverse affect arising from the difference between the drain voltage and the source voltage of the transistor at the moment when the pull-down unit or the pull-up unit is turned on.

SUMMARY OF THE INVENTION

Therefore, the present invention provides two-stage post driver circuit to minimize the adverse affect arising from the difference between the drain voltage and the source voltage of the transistor at the moment when the pull-down unit or the pull-up unit is turned on. Consequently, the possibility of damaging the transistor will be minimized.

A first embodiment of the present invention provides a two-stage post driver circuit for receiving a core output signal and generating a pad output signal to an output pad. The core output signal is in a range between a first source voltage and a ground voltage. The pad output signal is in a range between a second source voltage and the ground voltage. The two-stage post driver circuit includes a controlling circuit and a pull-up unit. The controlling circuit receives the core output signal and the pad output signal, and generates a first pull-up controlling signal and a second pull-up controlling signal according to the core output signal. The pull-up unit includes a first P-type transistor and a second P-type transistor. The second P-type transistor has a source terminal connected to the second source voltage, and a gate terminal receiving the second pull-up controlling signal. The first P-type transistor has a source terminal connected to a drain terminal of the second P-type transistor, a gate terminal receiving the first pull-up controlling signal, and a drain terminal connected to the output pad. During a transient period of switching the pad output signal from the ground voltage level to the second source voltage in response to the pad output signal, the pad output signal is served as the first pull-up controlling signal by the controlling circuit. Whereas, during a steady period after the transient period, a constant voltage is served as the first pull-up controlling signal by the controlling circuit.

A second embodiment of the present invention provides a two-stage post driver circuit for receiving a core output signal and generating a pad output signal to an output pad. The core output signal is in a range between a first source voltage and a ground voltage. The pad output signal is in a range between a second source voltage and the ground voltage. The two-stage post driver circuit includes a controlling circuit and a pull-down unit. The controlling circuit for receiving the core output signal and the pad output signal, and generating a first pull-down controlling signal and a second pull-down controlling signal according to the core output signal. The pull-down unit includes a first N-type transistor and a second N-type transistor. The second N-type transistor has a source terminal connected to the ground voltage, and a gate terminal receiving the second pull-down controlling signal. The first N-type transistor has a source terminal connected to a drain terminal of the second N-type transistor, a gate terminal receiving the first pull-down controlling signal, and a drain terminal connected to the output pad. During a transient period of switching the pad output signal from the second source voltage to the ground voltage in response to the core output voltage, the pad output signal is served as the first pull-down controlling signal by the controlling circuit. Wherein, during a steady period after the transient period, a constant voltage is served as the first pull-down controlling signal by the controlling circuit.

A third embodiment of the present invention provides a two-stage post driver circuit for receiving a core output signal and generating a pad output signal to an output pad, the core output signal being in a range between a first source voltage and a ground voltage, the pad output signal being in a range between a second source voltage and the ground voltage, the two-stage post driver circuit comprising: a controlling circuit for receiving the core output signal, and generating a first pull-up controlling signal, a second pull-up controlling signal according to the core output signal; a pull-up unit comprising a first P-type transistor and a second P-type transistor, wherein the second P-type transistor has a source terminal connected to the second source voltage, and a gate terminal receiving the second pull-up controlling signal, wherein the first P-type transistor has a source terminal connected to a drain terminal of the second P-type transistor, a gate terminal receiving the first pull-up controlling signal, and a drain terminal connected to the output pad; wherein during a first transient period after a level transition of the pad output signal from the ground voltage to the second source voltage, a voltage lower than a first constant voltage is served as the first pull-up controlling signal by the controlling circuit, and during a first steady period after the first transient period, the first constant voltage is served as the first pull-up controlling signal by the controlling circuit.

A fourth embodiment of the present invention provides a two-stage post driver circuit for receiving a core output signal and generating a pad output signal to an output pad, the core output signal being in a range between a first source voltage and a ground voltage, the pad output signal being in a range between a second source voltage and the ground voltage, the two-stage post driver circuit comprising: a controlling circuit for receiving the core output signal, and generating a first pull-down controlling signal and a second pull-down controlling signal according to the core output signal; a pull-down unit comprising a first N-type transistor and a second N-type transistor, wherein the second N-type transistor has a source terminal connected to the ground voltage, and a gate terminal receiving the second pull-down controlling signal, wherein the first N-type transistor has a source terminal connected to a drain terminal of the second N-type transistor, a gate terminal receiving the first pull-down controlling signal, and a drain terminal connected to the output pad, wherein during a second transient period after a level transition of the pad output signal from the second source voltage to the ground voltage, a voltage higher than the constant voltage is served as the first pull-down controlling signal by the controlling circuit, wherein during a second steady period after the second transient period, the constant voltage is served as the first pull-down controlling signal by the controlling circuit.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

In the conventional two-stage post driver circuit, the gate terminal of the first N-type transistor and the gate terminal of the first P-type transistor are both connected to a constant voltage (V1). When the pull-up unit or the pull-down unit is turned on, the gate voltage fails to provide sufficient pull-up strength or pull-down strength. Since the voltage difference between the drain terminal and the source terminal is too large, the first P-type transistor P1 or the first N-type transistor N1 is easily damaged. For obviating the drawbacks encountered from the prior art, the present invention provides an improved two-stage post driver circuit.

Figure 1A:
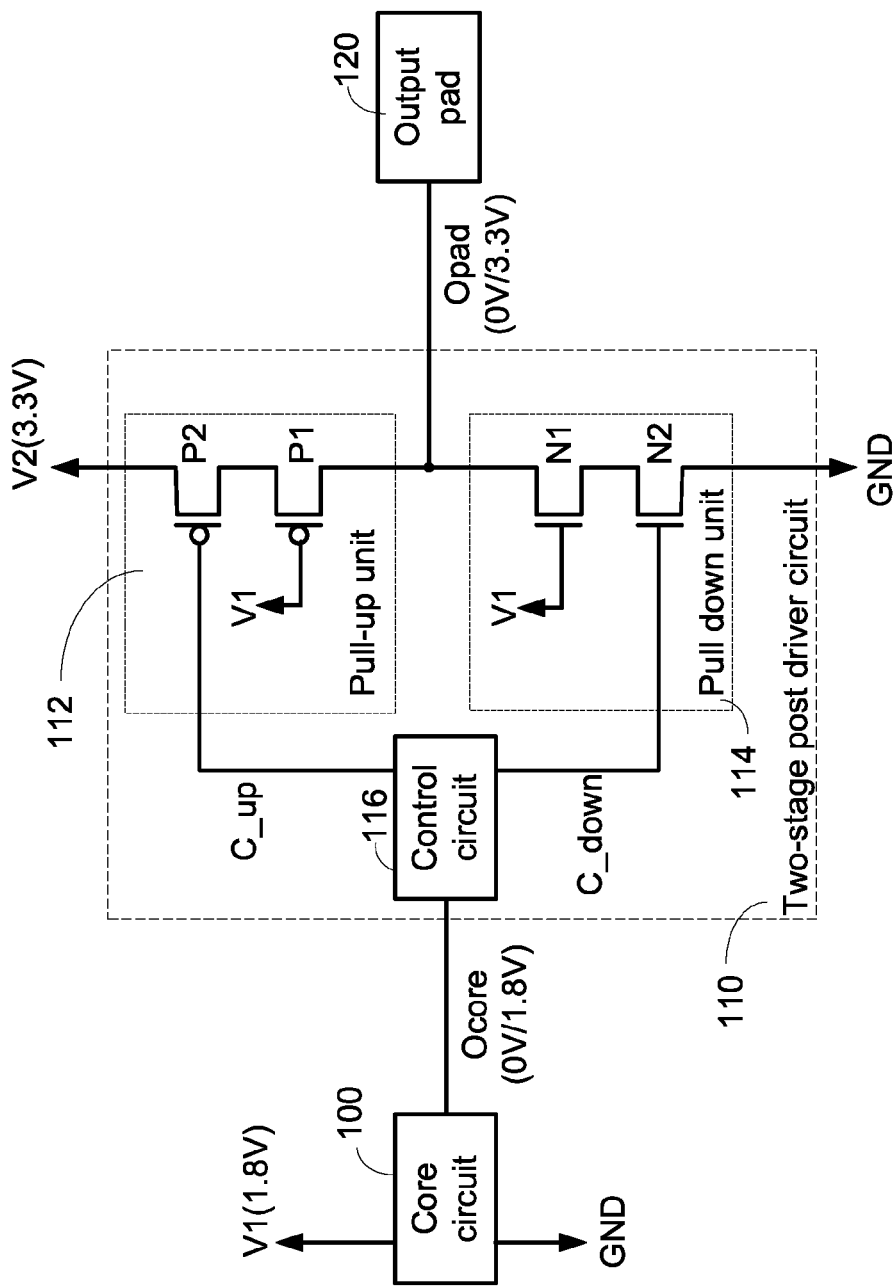
FIG. 1A (Prior art) is a schematic circuit diagram illustrating a conventional two-stage post driver circuit.
Figure 1B:
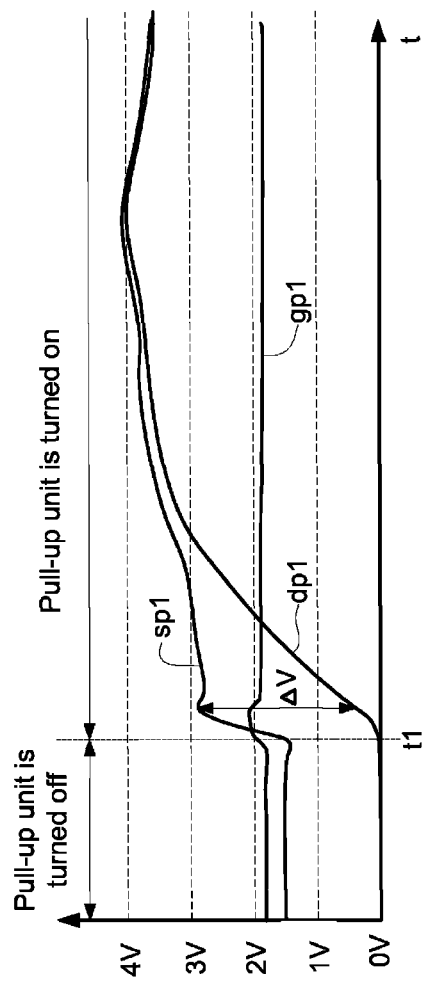
FIG. 1B (Prior art) is a plot illustrating the voltage changes at various terminals of the first P-type transistor P1 of the pull-up unit of the conventional two-stage post driver circuit when the pad output signal Opad is changed from a low voltage level (0V) to a high voltage level (3.3V)
Figure 2:
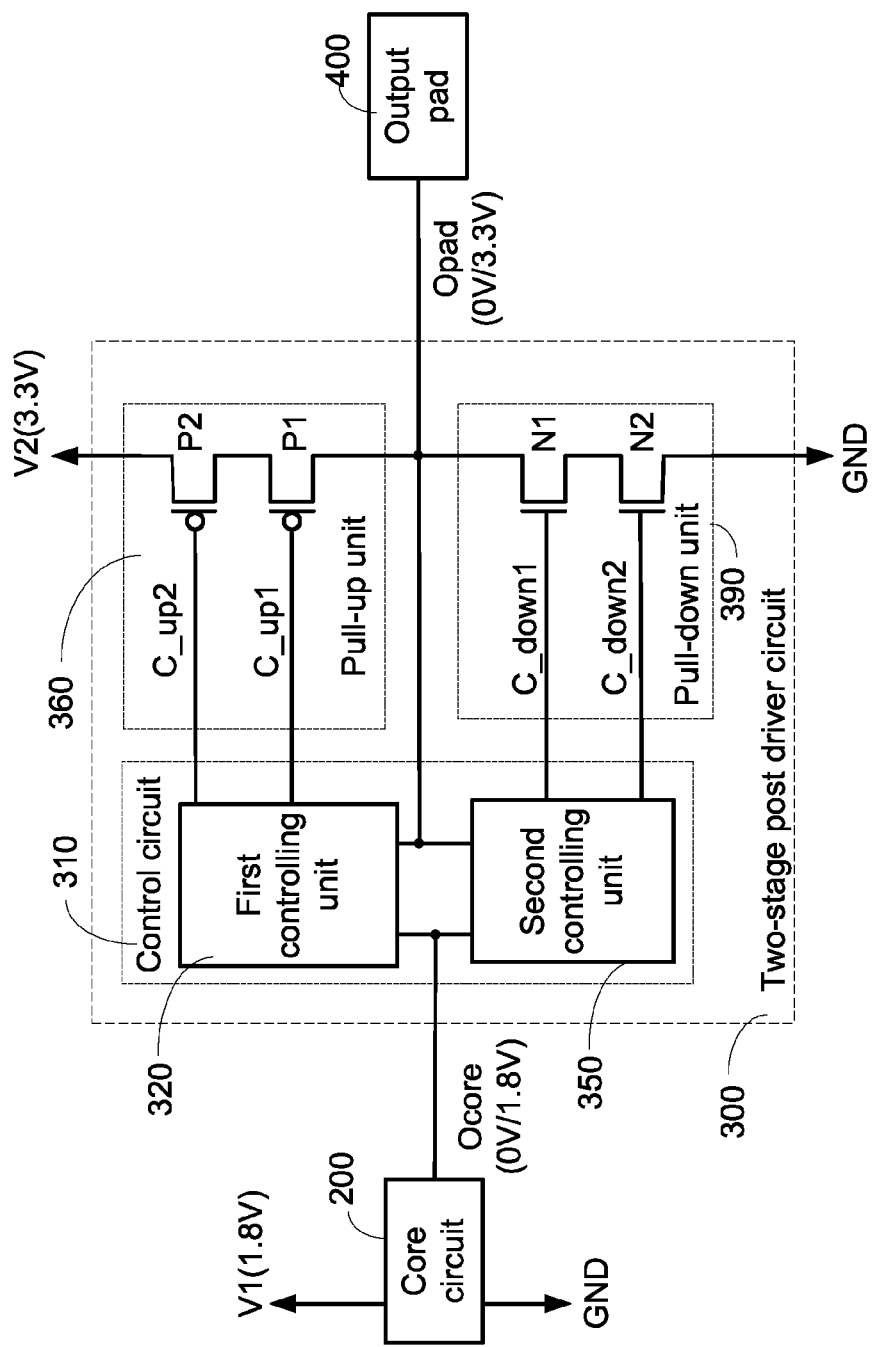
FIG. 2 is a schematic circuit diagram illustrating a two-stage post driver circuit according to an embodiment of the present invention.

FIG. 2 is a schematic circuit diagram illustrating a two-stage post driver circuit according to an embodiment of the present invention. The two-stage post driver circuit 300 is connected between a core circuit 200 and an output pad 400. The core circuit 200 is connected between a first source voltage V1 and a ground terminal GND. For example, the first source voltage V1 is 1.8V. Consequently, a core output signal Ocore outputted from the core circuit 100 is in the range 0V and 1.8V. That is, the high voltage level is 1.8V, and the low voltage level is 0V.

The two-stage post driver circuit 300 comprises a control circuit 310, a pull-up unit 360 and a pull-down unit 390. The control circuit 310 is used for receiving the core output signal Ocore and a pad output signal Opad, and generating a first pull-up controlling signal C_up1, a second pull-up controlling signal C_up2, a first pull-down controlling signal C_down1 and a second pull-down controlling signal C_down2.

The pull-up unit 360 comprises a first P-type transistor P1 and a second P-type transistor P2. The second P-type transistor P2 has a source terminal connected to a second source voltage V2 (e.g. 3.3V), and a gate terminal receiving the second pull-up controlling signal C_up2. The first P-type transistor P1 has a source terminal connected to a drain terminal of the second P-type transistor P2, a gate terminal receiving the first pull-up controlling signal C_up1, and a drain terminal connected to the output pad 400.

The pull-down unit 390 comprises a first N-type transistor N1 and a second N-type transistor N2. The second N-type transistor N2 has a source terminal connected to the ground terminal GND, and a gate terminal receiving the second pull-down controlling signal C_down2. The first N-type transistor N1 has a source terminal connected to a drain terminal of the second N-type transistor N2, a gate terminal receiving the first pull-down controlling signal C_down1, and a drain terminal connected to the output pad 400. Moreover, the two-stage post driver circuit 300 is used for generating a pad output signal Opad to the output pad 400. The pad output signal Opad is in the range between 0V and 3.3V. That is, the high voltage level is 3.3V, and the low voltage level is 0V.

The control circuit 310 comprises a first controlling unit 320 and a second controlling unit 350. According to the core output signal Ocore, the first pull-up controlling signal C_up1 and the second pull-up controlling signal C_up2 are generated by the first controlling unit 320. Similarly, according to the core output signal Ocore, the first pull-down controlling signal C_down1 and the second pull-down controlling signal C_down2 are generated by the second controlling unit 350.

In an embodiment, during a first transient period of switching the pad output signal Opad from the low voltage level to the high voltage level, the first controlling unit 320 provides a first transient path to have the pad output signal Opad serve as the first pull-up controlling signal C_up1. During a first steady period after the first transient period, the first controlling unit 320 provides a first source voltage V1 as the first pull-up controlling signal C_up1. Similarly, during a second transient period of switching the pad output signal Opad from the high voltage level to the low voltage level, the second controlling unit 350 provides a second transient path to have the pad output signal Opad serve as the first pull-down controlling signal C_down1. During a second steady period after the second transient period, the second controlling unit 350 provides the first source voltage V1 as the first pull-down controlling signal C_down1. The detailed circuit and operations of the two-stage post driver circuit will be illustrated as follows.

Figure 3A:
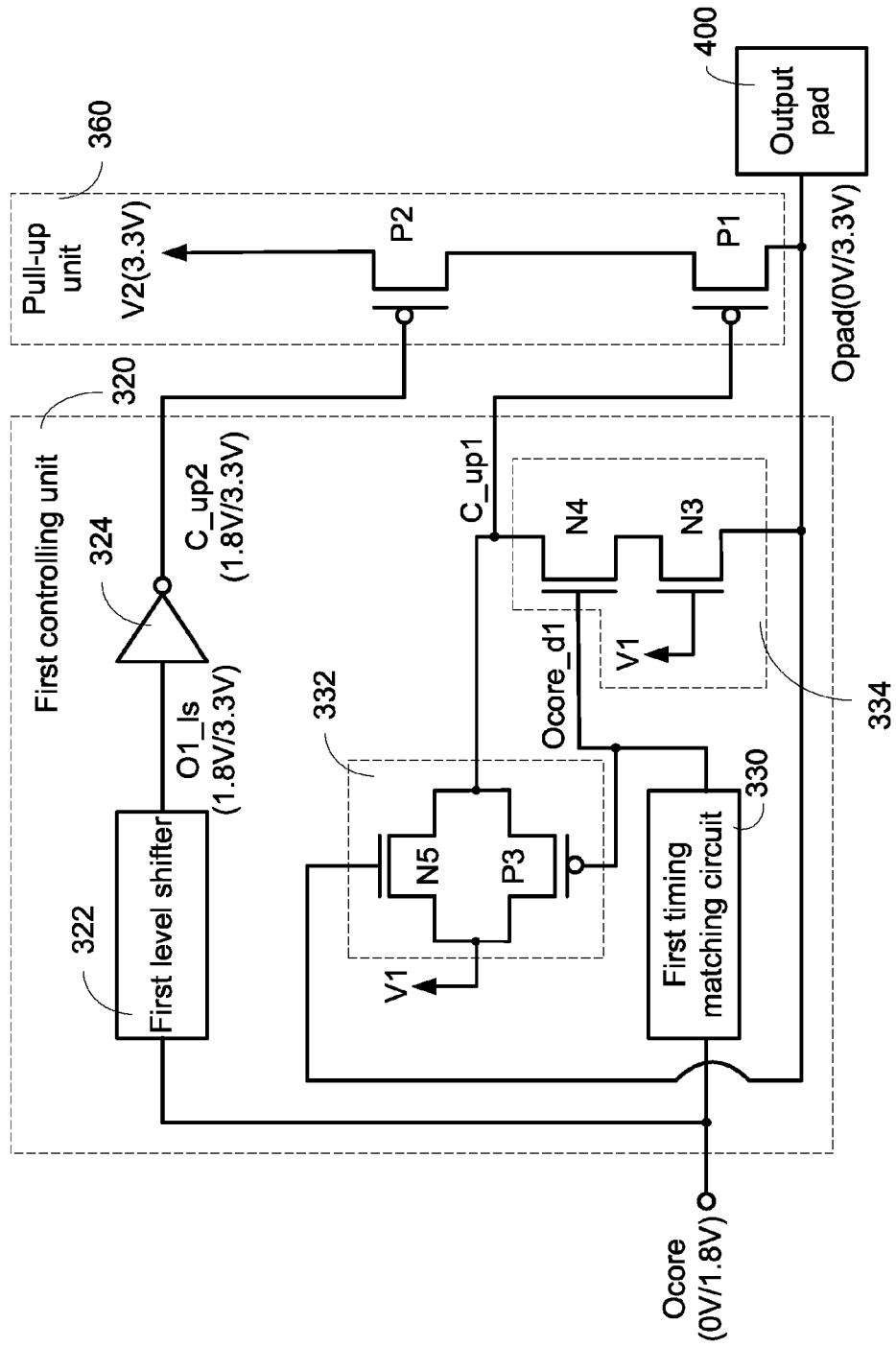
FIG. 3A is a schematic circuit diagram illustrating the first controlling unit of the two-stage post driver circuit of the present invention.

FIG. 3A is a schematic circuit diagram illustrating the first controlling unit of the two-stage post driver circuit of the present invention. As shown in FIG. 3A, the first controlling unit 320 comprises a first level shifter 322, a first inverter 324, a first transmission gate 332, a first timing matching circuit 330 and a first transient path 334.

The first level shifter 322 is used for receiving the core output signal Ocore and converting the core output signal Ocore into a first converted output signal O1_ls. The first converted output signal O1_ls is in the range between V1 (e.g. 1.8V) and V2 (e.g. 3.3V). That is, the high voltage level is 3.3V, and the low voltage level is 1.8V.

The first inverter 324 is used for receiving the first converted output signal O1_ls and converting the first converted output signal O1_ls into the second pull-up controlling signal C_up2. The second pull-up controlling signal C_up2 is in the range between V1 (e.g. 1.8V) and V2 (e.g. 3.3V). That is, the high voltage level is 3.3V, and the low voltage level is 1.8V.

The first timing matching circuit 330 is used for receiving the core output signal Ocore, and generating a first delayed core output signal Ocore_d1. The first transmission gate 332 has an input terminal connected to the first source voltage V1, an output terminal connected to the gate terminal of the first P-type transistor P1, a first control terminal connected to the output pad 400, and a second control terminal receiving the first delayed core output signal Ocore_d1. The first transient path 334 is connected between the output pad 400 and the gate terminal of the first P-type transistor P1. Moreover, the first transient path 334 has a control terminal receiving the first delayed core output signal Ocore_d1.

The first timing matching circuit 330 is used for adjusting the timing of generating the first pull-up controlling signal C_up1 and the second pull-up controlling signal C_up2 by the first controlling unit 320, so that the first pull-up controlling signal C_up1 and the second pull-up controlling signal C_up2 can be simultaneously propagated to the gate terminal of the first P-type transistor P1 and the gate terminal of the second P-type transistor P2, respectively. Alternatively, in some embodiments, the first timing matching circuit 330 is omitted, and the operations of the first controlling unit 320 are still normal.

Please refer to FIG. 3A again. The first transient path 334 comprises a third N-type transistor N3 and a fourth N-type transistor N4. The gate terminal of the third N-type transistor N3 is connected to the first source voltage V1 (1.8V). The gate terminal of the fourth N-type transistor N4 is served as the control terminal of the first transient path 334, and receives the first delayed core output signal Ocore_d1. In addition, the third N-type transistor N3 and the fourth N-type transistor N4 are serially connected between the output pad 400 and the gate terminal of the first P-type transistor P1.

The first transmission gate 332 comprises a third P-type transistor P3 and a fifth N-type transistor N5. The source terminal of the third P-type transistor P3 and the drain terminal of the fifth N-type transistor N5 are collectively connected as the input terminal of the first transmission gate 332, and connected to the first source voltage V1. The drain terminal of the third P-type transistor P3 and the source terminal of the fifth N-type transistor N5 are collectively connected as the output terminal of the first transmission gate 332, and connected to the gate terminal of the first P-type transistor P1. The gate terminal of the fifth N-type transistor N5 is served as the first control terminal of the first transmission gate 332, and is connected to the output pad 400. The gate terminal of the third P-type transistor P3 is served as the second control terminal of the first transmission gate 332, and receives the first delayed core output signal Ocore_d1.

It is noted that numerous modifications and alterations of the first level shifter 322 may be made while retaining the teachings of the invention. Moreover, since the first timing matching circuit 330 is only used for delaying signals, the detailed circuitry thereof is not redundantly described herein.

Figure 3B:
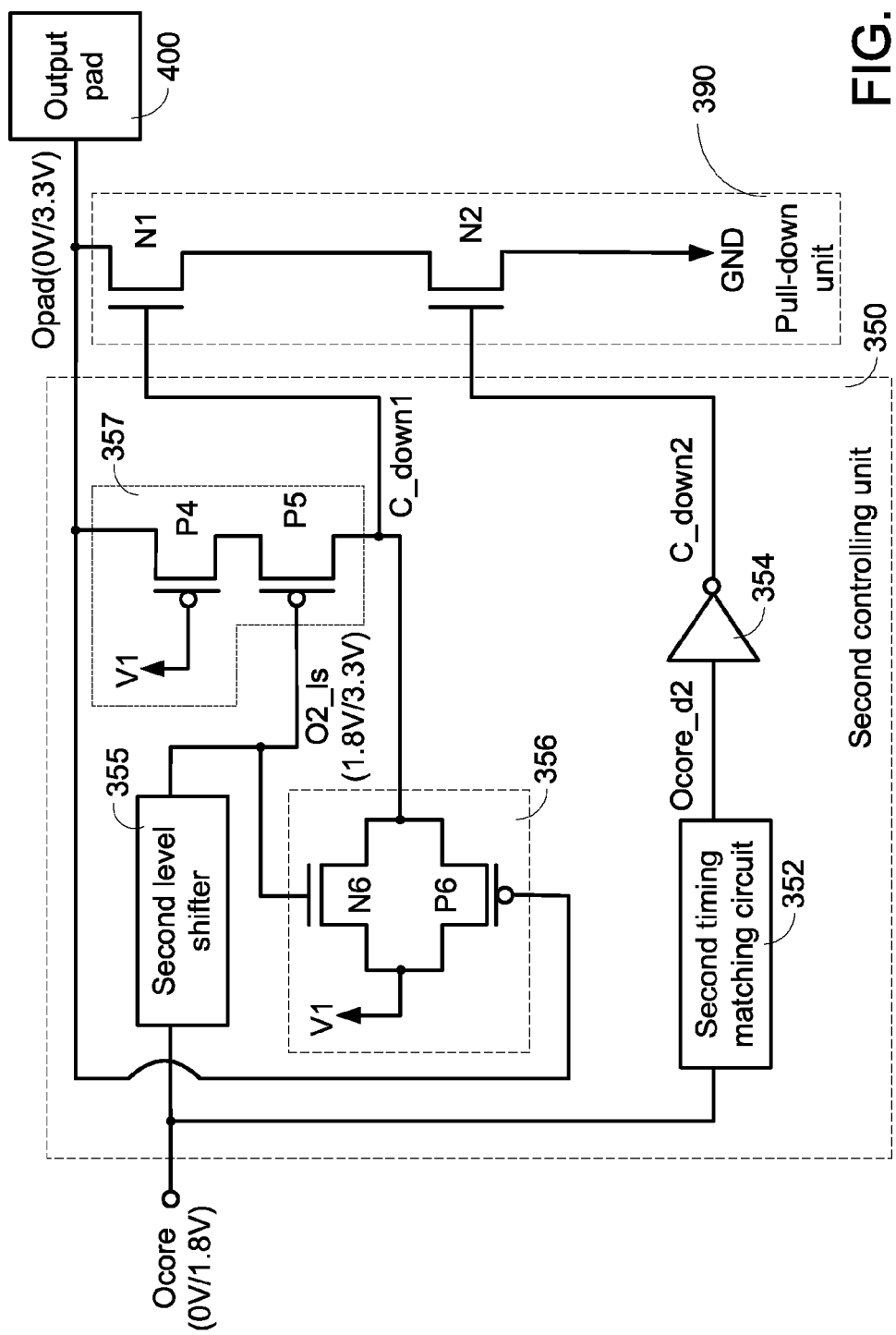
FIG. 3B is a schematic circuit diagram illustrating the second controlling unit of the two-stage post driver circuit of the present invention.

FIG. 3B is a schematic circuit diagram illustrating the second controlling unit of the two-stage post driver circuit of the present invention. As shown in FIG. 3B, the second controlling unit 350 comprises a second timing matching circuit 352, a second inverter 354, a second transmission gate 356, a second level shifter 355 and a second transient path 357.

The second timing matching circuit 352 is used for receiving the core output signal Ocore, and generating a second delayed core output signal Ocore_d2.

The second inverter 354 is used for receiving the second delayed core output signal Ocore_d2 and converting the second delayed core output signal Ocore_d2 into the second pull-down controlling signal C_down2. The second pull-down controlling signal C_down2 is in the range between 0V and V1 (1.8V). That is, the high voltage level is 1.8V, and the low voltage level is 0V.

The second level shifter 355 is used for receiving the core output signal Ocore and converting the core output signal Ocore into a second converted output signal O2_Is. The second converted output signal O2_Is is in the range between V1 (e.g. 1.8V) and V2 (e.g. 3.3V). That is, the high voltage level is 3.3V, and the low voltage level is 1.8V.

The second transmission gate 356 has an input terminal connected to the first source voltage V1, an output terminal connected to the gate terminal of the first N-type transistor N1, a first control terminal receiving the second converted output signal O2_Is, and a second control terminal connected to the output terminal 400. The second transient path 357 is connected between the output pad 400 and the gate terminal of the first N-type transistor N1. Moreover, the second transient path 357 has a control terminal receiving the second converted output signal O2_Is.

The second timing matching circuit 352 is used for adjusting the timing of generating the first pull-down controlling signal C_down1 and the second pull-down controlling signal C_down2 by the second controlling unit 350, so that the first pull-down controlling signal C_down1 and the second pull-down controlling signal C_down2 can be simultaneously propagated to the gate terminal of the first N-type transistor N1 and the gate terminal of the second N-type transistor N2, respectively. Alternatively, in some embodiments, the second timing matching circuit 352 is omitted, and the operations of the second controlling unit 350 are still normal.

Please refer to FIG. 3B again. The second transient path 357 comprises a fourth P-type transistor P4 and a fifth N-type transistor P5. The gate terminal of the fourth P-type transistor P4 is connected to the first source voltage V1 (1.8V). The gate terminal of the fifth N-type transistor P5 is served as the control terminal of the second transient path 357, and receives the second converted output signal O2_Is. In addition, the fourth P-type transistor P4 and the fifth N-type transistor P5 are serially connected between the output pad 400 and the gate terminal of the first N-type transistor N1.

The second transmission gate 356 comprises a sixth P-type transistor P6 and a sixth N-type transistor N6. The source terminal of the sixth P-type transistor P6 and the drain terminal of the sixth N-type transistor N6 are collectively connected as the input terminal of the second transmission gate 356, and connected to the first source voltage V1. The drain terminal of the sixth P-type transistor P6 and the source terminal of the sixth N-type transistor N6 are collectively connected as the output terminal of the second transmission gate 356, and connected to the gate terminal of the first N-type transistor N1. The gate terminal of the sixth N-type transistor N6 is served as the first control terminal of the second transmission gate 356, and receives the second converted output signal O2_Is. The gate terminal of the sixth P-type transistor P6 is served as the second control terminal of the second transmission gate 356, and is connected to the output pad 400.

It is noted that numerous modifications and alterations of the second level shifter 355 may be made while retaining the teachings of the invention. Moreover, since the second timing matching circuit 352 is only used for delaying signals, the detailed circuitry thereof is not redundantly described herein.

Please refer to FIGS. 3A and 3B again. In a case that the core output signal Ocore is at the steady low voltage level (0V), the first converted output signal O1_Is of the first controlling unit 320 is at the low voltage level (1.8V), and the second pull-up controlling signal C_up2 is at the high voltage level (3.3V). In addition, the first delayed core output signal Ocore_d1 is at the low voltage level (0V). Consequently, the first transient path 334 is turned off (or in the open state), and the first transmission gate 332 is in the close state. Meanwhile, the first pull-up controlling signal C_up1 is 1.8V. Under this circumstance, the second P-type transistor P2 is turned off, so that the pull-up unit 360 is turned off.

Moreover, in the second controlling unit 350, the second delayed core output signal Ocore_d2 is at the low voltage level (0V), the second pull-down controlling signal C_down2 is at the high voltage level (1.8V). In addition, the pad output signal Opad is at the low voltage level (0V). Consequently, the second transmission gate 356 is in the close state and the second transient path 357 is turned off (or in the open state). Under this circumstance, since the first N-type transistor N1 and the second N-type transistor N2 are turned on, the pull-down unit 390 is turned on, and the pad output signal Opad is at the low voltage level (0V).

During the beginning of a first transient period of switching the core output signal Ocore from the low voltage level to the high voltage level, the second delayed core output signal Ocore_d2 of the controlling unit 350 is at the high voltage level (1.8V), and the second pull-down controlling signal C_down2 is at the low voltage level (0V). In addition, the second converted output signal O2_Is is at the high voltage level (3.3V). Consequently, the second transient path 357 is turned off (or in the open state), and the second transmission gate 356 is in the close state. Under this circumstance, since the second N-type transistor N2 is turned off, the pull-down unit 390 is turned off.

Moreover, in the first controlling unit 320, the first converted output signal O1_Is is at the high voltage level (3.3V), and the second pull-up controlling signal C_up2 is at the low voltage level (1.8V). In addition, the first delayed core output signal Ocore_d1 is at the high voltage level (1.8V). Consequently, the first transmission gate 332 is in the open state, and the first transient path 334 is turned on. Meanwhile, the first pull-up controlling signal C_up1 is changed with the pad output signal Opad. Under this circumstance, since the pull-up unit 360 is turned on, the pad output signal Opad is gradually increased from the low voltage level (0V) to the high voltage level (3.3V).

Obviously, during the first transient period, the first pull-up controlling signal C_up1 is lower than V1 (1.8V). Consequently, the first P-type transistor P1 has stronger pull-up strength. Under this circumstance, the drain voltage and the source voltage are increased at substantially the same speed. Since the voltage difference is not too large, the possibility of damaging the first P-type transistor P1 will be minimized.

During a first steady period after the first transient period of switching the core output signal Ocore from the low voltage level to the high voltage level, the pull-down unit 390 is continuously turned off, and the operation thereof is not redundantly described herein. In addition, the second pull-up controlling signal C_up2 is continuously maintained at the low voltage level (1.8V), and the pad output signal Opad is higher than 1.8V. Consequently, the first transient path 334 is turned off (or in the open state), and the first transmission gate 332 is in the close state. Under this circumstance, the first pull-up controlling signal C_up1 is no longer changed with the pad output signal Opad and maintained at V1 (1.8V), and the pad output signal Opad is at the high voltage level (3.3V).

During the beginning of a second transient period of switching the core output signal Ocore from the high voltage level to the low voltage level, the first converted output signal O1_Is from the first level shifter 322 of the first controlling unit 320 is at the low voltage level (1.8V). In addition, the second pull-up controlling signal C_up2 is at the high voltage level (3.3V), and the first delayed core output signal Ocore_d1 is at the low voltage level (0V). Consequently, the first transient path 334 is turned off (or in the open state), and the first transmission gate 332 is in the close state. Under this circumstance, the second P-type transistor P2 is turned off, so that the pull-up unit 360 is turned off.

Moreover, during the beginning of the second transient period, the second delayed core output signal Ocore_d2 of the second controlling unit 350 is at the low voltage level (0V). In addition, the second pull-down controlling signal C_down2 is at the high voltage level (1.8V), and the second converted output signal O2_Is is at the low voltage level (1.8V). Consequently, the second transmission gate 356 is in the open state, and the second transient path 357 is turned on. Meanwhile, the first pull-down controlling signal C_down1 is changed with the pad output signal Opad. Under this circumstance, the pull-down unit 390 is turned on, and the pad output signal Opad is gradually decreased to the low voltage level (0V) from the high voltage level (3.3V).

Obviously, during the second transient period, the first pull-down controlling signal C_down1 is higher than V1 (1.8V). Consequently, the first N-type transistor N1 has stronger pull-down strength. Under this circumstance, the drain voltage and the source voltage are increased at substantially the same speed. Since the voltage difference is not too large, the possibility of damaging the first N-type transistor N1 will be minimized.

During a second steady period after the second transient period of switching the core output signal Ocore from the high voltage level to the low voltage level, the pull-up unit 360 is continuously turned off, and the operation thereof is not redundantly described herein. In addition, the second pull-down controlling signal C_down2 is continuously maintained at the high voltage level (1.8V), and the pad output signal Opad is lower than 1.8V. Consequently, the second transient path 357 is turned off (or in the open state), and the second transmission gate 356 is in the close state. Under this circumstance, the first pull-down controlling signal C_down1 is no longer changed with the pad output signal Opad and maintained at V1 (1.8V), and the pad output signal Opad is at the low voltage level (0V).

Figure 3C:
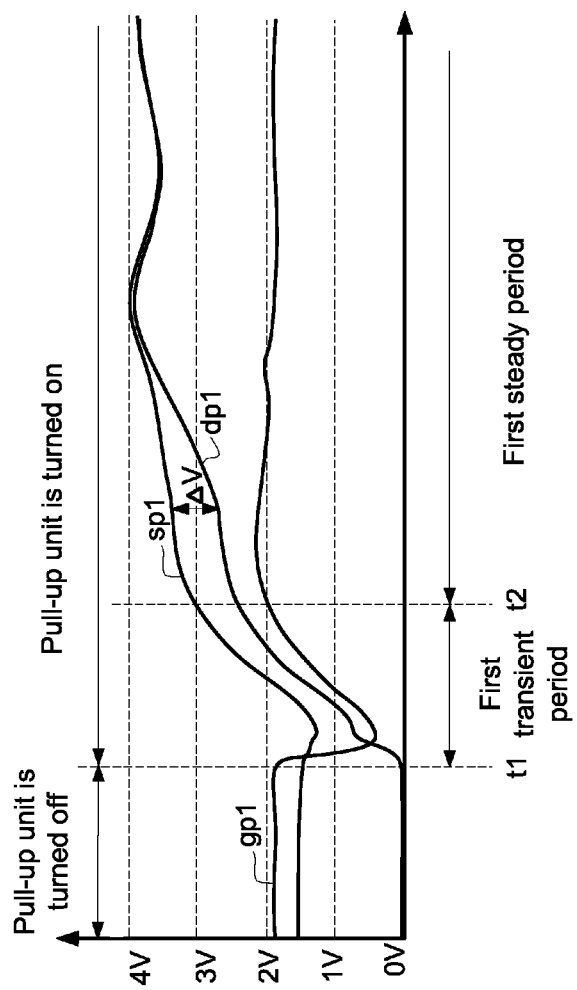
FIG. 3C is a plot illustrating the voltage changes at various terminals of the first P-type transistor P1 of the present two-stage post driver circuit when the pad output signal Opad is changed from a low voltage level (0V) to a high voltage level (3.3V).

FIG. 3C is a plot illustrating the voltage changes at various terminals of the first P-type transistor P1 of the present two-stage post driver circuit when the pad output signal Opad is changed from a low voltage level (0V) to a high voltage level (3.3V). Before the time spot t1, the pull-down unit 390 is turned on, and the pull-up unit 360 is turned off. Consequently, the voltage (gp1) at the gate terminal of the first P-type transistor P1 is continuously maintained at the first source voltage V1 (1.8V). Since the drain terminal of the first P-type transistor P1 is connected to the output pad 400, the voltage (dp1) at the drain terminal of the first P-type transistor P1 is 0V. Since the source terminal of the first P-type transistor P1 is in the floating state, the voltage (sp1) at the source terminal of the first P-type transistor P1 is about 1.5V. At the time spot t1, the pull-up unit 360 is turned on and the pull-down unit 390 is turned off. Consequently, the pad output signal Opad is subject to level transition.

During the first transient period from the first time spot t1 to the second time spot t2, the first transient path 334 is turned on, so that the first pull-up controlling signal C_up1 received by the gate terminal of the first P-type transistor P1 is changed with the pad output signal Opad. Meanwhile, the first pull-up controlling signal C_up1 is lower than V1 (1.8V). Consequently, the first P-type transistor P1 has a stronger pull-up strength. Under this circumstance, the drain voltage and the source voltage are increased at substantially the same speed. Since the voltage difference (AV) is not too large, the possibility of damaging the first P-type transistor P1 will be minimized.

During the first steady period after the time spot t2, the first transient path 334 is turned off. Meanwhile, the first pull-up controlling signal C_up1 received by the gate terminal of the first P-type transistor P1 is outputted from the first transmission gate 332, and maintained at the first source voltage (V1).

Similarly, during the second transient period of switching the core output signal Ocore from the high voltage level to the low voltage level, the second transient path may cause the first pull-up controlling signal C_up1 to be changed with the core output signal Ocore. Consequently, the voltage at the gate terminal of the first N-type transistor N1 is higher than 1.8V, and the pull-down strength thereof is increased. Since the voltage difference between the drain terminal and the source terminal is not too large, the possibility of damaging the first N-type transistor N1 will be minimized.

It is noted that numerous modifications and alterations of the two-stage post driver circuit of the present invention may be made while retaining the teachings of the invention. For example, the controlling circuit 310 may only include the first controlling unit 320, wherein the second controlling unit 350 is exempted. Under this circumstance, as shown in FIG. 3A, the first P-type transistor P1 of the pull-up unit 360 can be protected by the two-stage post driver circuit. Alternatively, the controlling circuit 310 may only include the second controlling unit 350, wherein the first controlling unit 320 is exempted. Under this circumstance, as shown in FIG. 3B, the first N-type transistor N1 of the pull-down unit 390 can be protected by the two-stage post driver circuit.

From the above description, the first P-type transistor P1 of the pull-up unit and the first N-type transistor N1 of the pull-down unit are selectively connected to the pad output signal Opad or a constant voltage (V1). When the pull-up unit or the pull-down unit is turned on, the gate voltage can provide sufficient pull-up strength or pull-down strength. Consequently, the possibility of damaging the first P-type transistor P1 or the first N-type transistor N1 will be minimized.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A two-stage post driver circuit, for receiving a core output signal from a core circuit, and generating a pad output signal to an output pad, comprising:
    a controlling circuit, for receiving the core output signal and the pad output signal, and generating a first pull-down controlling signal and a second pull-down controlling signal according to the core output signal;
    a pull-down unit comprising a first N-type transistor and a second N-type transistor, wherein the second N-type transistor has a source terminal connected to a ground voltage, and a gate terminal receiving the second pull-down controlling signal, wherein the first N-type transistor has a source terminal connected to a drain terminal of the second N-type transistor, a gate terminal receiving the first pull-down controlling signal, and a drain terminal connected to the output pad; and
    a pull-up unit connecting said output pad to a second source voltage;
    wherein the core output signal is in a range between a first source voltage and the ground voltage, and the core circuit is connecting to the first source voltage; and
    wherein during a first transient period of switching the pad output signal from the second source voltage to the ground voltage in response to the core output signal, the pad output signal is served as the first pull-down controlling signal by the controlling circuit, wherein during a first steady period after the transient period, a constant voltage is served as the first pull-down controlling signal by the controlling circuit.

2. The two-stage post driver circuit as claimed in claim 1, wherein the controlling circuit comprises:
    a transient path connected between the gate terminal of the first N-type transistor and the output pad; and
    a transmission gate having an input terminal receiving the first source voltage, and an output voltage connected to the gate terminal of the first N-type transistor,
        wherein during the transient period, the transmission gate is in an open state, and the pad output signal is transmitted to the gate terminal of the first N-type transistor through the transient path, wherein during the steady period, the transient path is in an open state, and the first source voltage is transmitted to the gate terminal of the first N-type transistor through the transmission gate.

3. The two-stage post driver circuit as claimed in claim 2, wherein the controlling circuit further comprises:
    a timing matching circuit for receiving the core output signal, and generating a delayed core output signal;
    an inverter for receiving the converted output signal, and generating the second pull-down controlling signal;
    a level shifter for receiving the core output signal, and generating a converted output signal; and
    the transmission gate having a first control terminal receiving the converted output signal, and a second control terminal connected to the output pad; and
    the transient path having a control terminal receiving the converted output signal.

4. The two-stage post driver circuit as claimed in claim 3, wherein the transient path comprises a first P-type transistor and a second P-type transistor, wherein the first P-type transistor has a gate terminal connected to the first source voltage, the second P-type transistor has a gate terminal served as the control terminal of the transient path for receiving the converted output signal, and the first P-type transistor and the second P-type transistor are serially connected between the output pad and the gate terminal of the first N-type transistor.

5. The two-stage post driver circuit as claimed in claim 3, wherein the transmission gate comprises a third P-type transistor and a third N-type transistor, wherein a source terminal of the third P-type transistor and a drain terminal of the third N-type transistor are collectively connected as the input terminal of the transmission gate and connected to the first source voltage, wherein a drain terminal of the third P-type transistor and a source terminal of the third N-type transistor are collectively connected as the output terminal of the transmission gate and connected to the gate terminal of the first N-type transistor, wherein a gate terminal of the third N-type transistor is served as the first control terminal of the transmission gate for receiving the converted output signal, wherein a gate terminal of the third P-type transistor is served as the second control terminal of the transmission gate and connected to the output pad.

6. The two-stage post driver circuit as claimed in claim 1, further comprising:

the controlling circuit capable of generating a first pull-up controlling signal, a second pull-up controlling signal according to the core output signal;

the pull-up unit comprising a first P-type transistor and a second P-type transistor, wherein the second P-type transistor has a source terminal connected to the second source voltage, and a gate terminal receiving the second pull-up controlling signal, wherein the first P-type transistor has a source terminal connected to a drain terminal of the second P-type transistor, a gate terminal receiving the first pull-up controlling signal, and a drain terminal connected to the output pad;

wherein during a second transient period of switching the pad output signal from the ground voltage to the second source voltage in response to the core output signal, the pad output signal is served as the first pull-up controlling signal by the controlling circuit, wherein during a second steady period after the first transient period, a constant voltage is served as the first pull-up controlling signal by the controlling circuit.

7. A two-stage post driver circuit for receiving a core output signal from a core circuit, and generating a pad output signal to an output pad, comprising:

a controlling circuit for receiving the core output signal, and generating a first pull-down controlling signal and a second pull-down controlling signal according to the core output signal;

a pull-down unit comprising a first N-type transistor and a second N-type transistor, wherein the second N-type transistor has a source terminal connected to a ground voltage, and a gate terminal receiving the second pull-down controlling signal, wherein the first N-type transistor has a source terminal connected to a drain terminal of the second N-type transistor, a gate terminal receiving the first pull-down controlling signal, and a drain terminal connected to the output pad; and a pull-up unit connecting said output pad to a second source voltage;

wherein the core output signal is in a range between a first source voltage and the ground voltage, and the core circuit is connecting to the first source voltage; and wherein during a first transient period of the pad output signal from the second source voltage to the ground voltage, a voltage higher than a constant voltage is served as the first pull-down controlling signal by the controlling circuit, wherein during a first steady period after the first transient period, the constant voltage is served as the first pull-down controlling signal by the controlling circuit.

* * * * *